United States Patent
Kubota et al.

(10) Patent No.: US 6,534,207 B2
(45) Date of Patent: Mar. 18, 2003

(54) PROCESS FOR PRODUCING AMORPHOUS MATERIAL CONTAINING SINGLE CRYSTAL OR POLYCRYSTAL AND MATERIAL PRODUCED

(75) Inventors: Yoshinori Kubota, Yamaguchi (JP); Natsuya Nishimura, Yamaguchi (JP)

(73) Assignee: Central Glass Company, Limited, Ube (JP)

(*) Notice: Subject to any disclaimer, the term of this patent is extended or adjusted under 35 U.S.C. 154(b) by 0 days.

(21) Appl. No.: 09/832,992

(22) Filed: Apr. 12, 2001

(65) Prior Publication Data

US 2001/0019014 A1 Sep. 6, 2001

Related U.S. Application Data

(62) Division of application No. 09/397,122, filed on Sep. 16, 1999, now Pat. No. 6,261,420.

(30) Foreign Application Priority Data

Sep. 21, 1998 (JP) ............................................. 10-266385

(51) Int. Cl.⁷ ................................................ B32B 9/04
(52) U.S. Cl. ...................... 428/700; 428/697; 428/699; 428/701; 428/702
(58) Field of Search ................................. 428/700, 697, 428/699, 701, 702

(56) References Cited

U.S. PATENT DOCUMENTS

| | | | | |
|---|---|---|---|---|
| 3,585,088 A | * | 6/1971 | Schwuttke et al. | 148/174 |
| 4,464,557 A | * | 8/1984 | Risbud et al. | 219/121.65 |
| 5,593,497 A | * | 1/1997 | Matsuyama et al. | 117/106 |
| 5,789,055 A | * | 8/1998 | Yoon | 369/283 |
| 5,955,388 A | * | 9/1999 | Dejneka | 501/3 |
| 6,027,826 A | * | 2/2000 | deRochemont et al. | 156/292 |

FOREIGN PATENT DOCUMENTS

JP 359074526 * 4/1984

* cited by examiner

Primary Examiner—John J. Zimmerman
Assistant Examiner—Andrew T Piziali
(74) Attorney, Agent, or Firm—Crowell & Moring LLP

(57) ABSTRACT

Pulsed light is irradiated to an amorphous base material, to produce therein one or more single crystals or polycrystals having nonlinear characteristic advantageous for light communication and laser technique. An external field such as electric field or magnetic field may be applied to the amorphous material, or a seed crystal or crystalline substrate may be used to promote crystallization from a contact interface between the amorphous material and the seed crystal or crystalline substrate.

33 Claims, 2 Drawing Sheets

PROCESS FOR PRODUCING AMORPHOUS MATERIAL CONTAINING SINGLE CRYSTAL OR POLYCRYSTAL AND MATERIAL PRODUCED

This application is a division of application Ser. No. 09/397,122, filed Sep. 16, 1999 now U.S. Pat. No. 6,261,420.

BACKGROUND OF THE INVENTION

The present invention relates to processes for producing amorphous or crystalline materials used for optical communication, lasers and other applications, and produced amorphous or crystalline materials.

Single-crystal or polycrystalline optical devices perform important roles in the fields of optical communication and lasers. Especially in optical communication, devices utilizing nonlinear characteristics of crystals are used for wavelength conversion and optical isolator. Nonlinear optical crystals are grown by various methods. Examples are; method (such as Czochralski method) of pulling a seed crystal up from a melt of a well-controlled composition, method (LPE) of inserting a substrate of matched lattice constants into a melt of a desired composition, and vapor phase growth method (such as MOCVD).

Amorphous material is superior in productivity to crystalline material. Examples are; quartz glass usable for fiber, optical glass usable for lens and amorphous film usable for reflection and wavelength selection. However, amorphous materials are low in nonlinearity, and hence inferior in properties as optical device, to crystalline materials.

SUMMARY OF THE INVENTION

It is an object of the present invention to provide a process or method of producing an amorphous material containing single crystal and/or polycrystal, and to provide an amorphous material containing single crystal and/or polycrystal.

The recent development in optical communication based mainly on fiber optics, and the advance in laser technique further increase the demand for functional optical devices with higher efficiency, smaller size, lower loss, lower noise, and ease of connection with fiber. However, crystals, though high in efficiency, are inferior in connectability with fiber and productivity, and costly. On the other hand, amorphous materials having good connectability and advantage in cost are problematical in efficiency.

Conventional crystal fabricating methods involve a complicated sequence of steps, such as crystal growth, cutting into pieces, optical polishing, alignment of optical axes, assemblage and inspection, eventually increasing the cost of production. Specifically, the growth rate (or velocity) of a single crystal is normally lower than a level of several mm/hr, and impeditive to the production efficiency. Furthermore, inspection of crystal orientation, optical surface polishing and other posterior steps are complicated and causative of cost increase. The conventional crystal or crystal device fabricating methods are not always adequate for supply of products in large quantity at low cost.

Amorphous material is suitable for mass production. However, amorphous material is inferior to crystals in performance and efficiency. For example, second order nonlinear characteristic used for wavelength conversion is unattainable from amorphous material.

Therefore, there is a demand for devices and materials which are advantageous in productivity like amorphous material, superior in performance and efficiency like crystalline material, and appropriate for connection with fiber.

As a result of investigation, the inventors of this application have found that it is possible to produce a single crystal, a polycrystal or an amorphous material containing a single crystal or polycrystal by irradiating pulse light to an amorphous base material (such as glass or amorphous film) of an appropriate composition and thereby forming a crystalline region selectively in an irradiated or light-condensed portion.

A production method according to the present invention is a method of producing an amorphous material containing at least one crystalline (monocrystalline or polycrystalline) region by irradiating pulse light to an original amorphous base material.

DETAILED DESCRIPTION OF THE INVENTION

Figure 1:
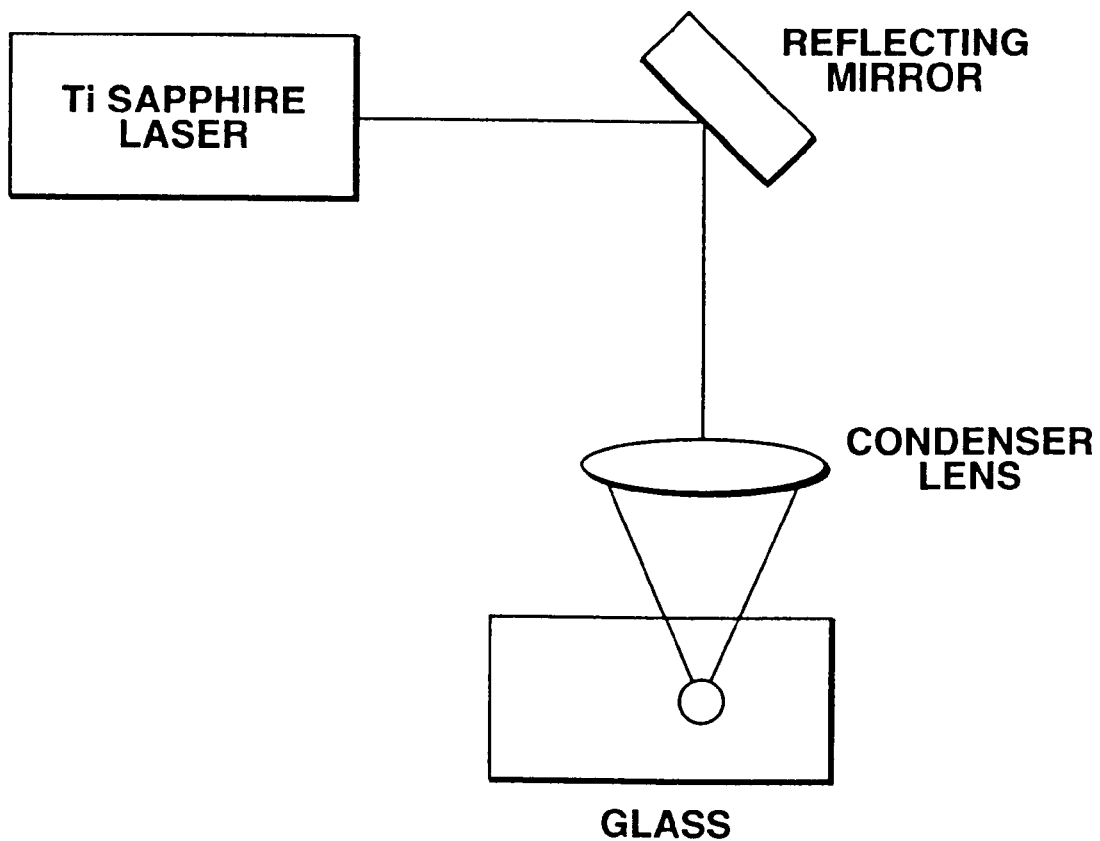
FIG. 1 is a schematic view showing production process and system according to one embodiment of the present invention, for producing a crystal in an amorphous material.

As is well known, a crystal is formed by heat treatment of amorphous material (such as glass or amorphous film) of a properly chosen composition. However, heating is inappropriate to selective crystallization only in a limited portion or portions, and difficult to control crystal grain size. Crystallization by heat treatment is practically inadequate as a method for producing functional devices.

Light energy typified by laser is superior in controllability, so that irradiation and condensation can be effected only in a specified region for a specified time duration. Recently, light sources having large pulse energy become available, and a report is presented that formation and disappearance of crystals in photosensitive amorphous materials {Hiromi Kondo et al., 45th Conference of Japan Society of Applied Physics and Related Society (*Oyo Buturi Kankei Rengo Koenkai*)(1999 spring) 28p-G-4}. However, the reported method further requires heat treatment for crystallization. This method is not completely free from the problems of heat treatment.

Unlike the method using heat, crystallization solely by light energy makes it possible to form crystals only in selected regions even in thermally unstable amorphous materials, and thereby to produce new materials.

As to light irradiation method, it is possible to employ any light irradiation method as long as sufficient light energy can be supplied for crystallization. Crystallization can be readily limited within a predetermined region by selective irradiation by using mask or condensing light. It is possible to form a crystalline structure only in an internal portion by condensing light into a predetermined portion in the interior of amorphous material with an adequate light condensing system and a source of adequate light intensity until light energy density required for crystallization is reached only in a region to which light is condensed.

As to a light source, any device suffices as long as sufficient light energy can be supplied for crystallization. In view of control of irradiation position and depth of focus, the use of a laser is preferable. Specifically, a pulsed laser is preferable because of its capability of enhancing irradiation energy density in light condensation. In the case of a pulsed laser, the pulse width is preferably shorter than or equal to $10^{-9}$ second in order to prevent damage in the material.

The composition of an amorphous material can be selected unlimitedly in the present invention as long as a desired crystal can be formed from that composition. Therefore, it is preferable to select an amorphous material having a composition relatively similar to the composition of a desired crystal Crystals having significant optical nonlinear characteristics of second order are; $KTiOPO_4$ (KTP), $LiNbO_3$ (LN), $LiTaO_3$ (LT), $LiB_3O_5$ (LBO), $\beta$-$BaB_2O_4$ ($\beta$-BBO), $CsLiB_6O_{10}$ (CLBO), and $GdCa_4B_3O_{10}$ (GdCBO). This list is neither exhaustive nor limiting. It is optional to select from various other crystals. These crystals are characterized by inclusion of Nb, La, Li or B as positive ion. The B—O bond and P—O bond are said to contribute directly to the nonlinearity in these crystals. The B—O bond, P—O bond and Nb—O bond are known to form a network structure of amorphous material, and an amorphous material can be produced even with a composition relatively close to the composition of a crystal. As non-exhaustive and non-limitative examples of an amorphous composition for forming these crystals, $Li_2O$—$SiO_2$—$B_2O_3$ amorphous is suitable for LBO, $Li_2O$—$Nb(Ta)_2O_5$—$SiO_2$ for LN and LT, and $SiO_2$—$BaO$—$B_2O_3$ for BBO.

Crystals exhibiting significant photoelectric effect (such as piezoelectricity or ferroelectricity) are oxides and fluorides including one or more of Ti, Ta, Nb, W, Mo, Si, Li, Ca, Sr, Ba, Bi, Al and Ga. Non-exhaustive, non-limitative examples are: $BaTiO_3$ (BTO), $Sr_{0.75}Ba_{0.25}Nb_2O_6$ (SBN), $Ba_2NaNb_5O_{15}$ (BNN), $La_3Ga_5SiO_{14}$ (langasite), $Bi_{12}SiO_{20}$ (BSO), $Bi_{12}GeO_{20}$ (BGO), and $Pb(Zr, Ti)O_3$ (PZT). As non-exhaustive and non-limitative examples of an amorphous composition for forming these crystals, $BaO$-$TiO_2$-$SiO_2$ amorphous is suitable for BTO, $SrO$-$BaO$-$Nb_2O_5$-$SiO_2$ for SBN, $La_2O_3$-$Ga_2O_3$-$SiO_2$ for langasite, and $Bi_2O_3$-$SiO_2$ for BSO.

Crystals exhibiting significant photomagnetic effect are crystals including transition metal or rare earth. $Y_3Fe_5O_{12}$ (YIG) is one example among other possibilities. To form a crystal of YIG, $Y_2O_3$—$Fe_2O_3$—$SiO_2$—$Na_2O$ amorphous is a suitable candidate.

As a crystal functioning as laser oscillation medium, these are crystals having, as additive, rare earth and transition metal. Examples of additive active elements are: Ce, Pr, Nd, Eu, Dy, Ho, Er, Tm, Yb, Cr, Mn, Fe, Ni and Ti. The valence may be two, three or four. In particular, Ce, Pr, Nd, Eu, Dy, Ho, Tm, Yb, Cr, Mn, Ni, Fe and Ti are known to assume various numbers of valence depending on the degree of oxidation and reduction. Recent knowledge teaches that the valences of these elements can be changed by irradiation of ultra-short pulse laser. By controlling the valence simultaneously with crystallization, it is possible to form a crystalline region which is different in valence from the surrounding amorphous background region. In any ordinary laser crystal having some degree of absorption in excitation wavelength and oscillation wavelength, a region having a high excitation energy density contributes to laser oscillation but the remaining portion causes a loss. By contrast, a structure including a crystalline region having an adjusted valence number distinguished from a surrounding amorphous enables adjustment to eliminate absorption in excitation wavelength and laser oscillation wavelength in the amorphous background, so that a laser material having a low threshold is obtainable. Examples of crystals are: $Y_3Al_5O_{12}$ (YAG), $Gd_3Ga_5O_{12}$ (GGG), $LiYF_4$ (YLF), $LiSrAlF_6$ (LiSAF), $Al_2O_3$ (sapphire), and ruby. These crystals are formed from various amorphous compositions. Preferable examples are $Y(Gd)_2O_3$-$Al(Ga)_2O_3$-$SiO_2$-$Na_2O$ for YAG and GGG, and $LiF$-$SrF_2$-$AlF_3$-$Ba(PO_3)_2$ for LiSAF.

In the present invention, use is made of an amorphous material including an element or elements constituting a desired crystal such as crystals listed above To achieve the above-mentioned effects and operations, an amorphous base material preferably includes at least one element selected from B, Ti, Ta, Nb, La, W, Mo, Si, Li, Ca, Sr, Ba, Bi, Al and Ga.

In the fabricating method according to the present invention, it is optional to apply an external field to an amorphous base material during any one or more of a period anterior to irradiation of light such as pulsed light, a period of irradiation and a period posterior to the irradiation. Crystallization under an external field is desirable for control of crystal orientation and formation of single domain. As the external field, selection is possible from electric field, magnetic field, and a field of high energy radiation such as X-ray or $\gamma$-ray. The electric field and magnetic field are specifically effective.

To control the crystal orientation, the use of a seed crystal or a substrate having a controlled orientation is effective. In this case, an amorphous material is put in contact with a seed crystal or a substrate, and parameters for irradiation of pulsed light and light condensation are controlled to cause crystallization to begin from the contact region between the seed crystal or substrate and the amorphous material. By controlling the rate of crystallization properly, it is possible to form a monocrystalline or polycrystalline region having a desired shape and having no or little defects, at a selected position.

A crystalline region formed by the method according to the present invention is confined in an amorphous base material. Such a confined crystalline region is advantageous in that crystal habit is unlikely to take place. In a widely used method for forming single-crystal fiber from a melt, crystal habit appears in the fiber surface, and hence disturbs the formation of a circular cross section to such an extent as to increase transmission loss and limit application for functional devices. By contrast to this, a single-crystal or polycrystalline region formed by the method according to the present invention is enclosed in a surrounding amorphous base layer, so that there exist no free surface in which crystal habit can appear. Therefore, it is possible to produce single crystal or polycrystalline solids having a circular cross section to the advantage of loss reduction.

In the case of crystallization from an amorphous film, it is readily possible to produce a film having an amorphous surface and a crystalline surface by using, as a substrate, a wafer having appropriate lattice constants. The film surface of the original amorphous film held away from the wafer remains amorphous whereas the film surface in contact with the wafer undergoes crystallization.

As to pulsed light for irradiation, there is no limitation as long as sufficient pulse energy can be supplied for crystallization, depending on the kind of an amorphous base material. In order to produce a crystalline region in a three dimensional manner, it is preferable to choose the wavelength of radiation so that it is not absorbed heavily by the base material. As such a source of pulsed light, a laser is preferable. In particular, a tunable laser is advantageous because of its capability of optimizing the wavelength in conformity with the light transmission characteristic of an amorphous base material.

As to a pulse width of a pulsed laser, a range from pico second to femto second is preferable since the energy per pulse is high. As a laser of such a type, many lasers are available, such as Ti-added sapphire laser, Cr-added LiSrAlF$_6$ laser, Cr-added YAG laser, dye laser, and pulse compression fiber laser. Conversion to a desired wavelength through a parametric oscillator, and amplification of pulse energy through a regenerative amplifier are desirable methods for utilizing these lasers. Furthermore, the simultaneous use of two or more lasers is possible for crystallization. In this case, it is possible to arrange lasers each having a low power density insufficient for crystallization in such a manner as to effect crystallization only at an intersection point at which the lasers meet. It is further possible to construct a crystal forming system of a high productivity in which a plurality of lasers are arranged to form a plurality of intersection points at which crystallization occurs simultaneously. A preferable light power density of pulse light at a light condensed region is equal to or higher than $10^9$ W/cm$^2$.

Periodical modulation of pulsed light energy in time and/or space is effective in forming a structure having a periodic alteration in crystal form or crystal size to provide various functions. Depending on the response characteristic of an amorphous base material, similar effects may be achieved by periodic modulation of external field applied before, during and/or after irradiation of pulsed light. The external field may be electric field, magnetic field or high energy radiation such as X ray and gamma ray. The temporal periodic modulation can be achieved, for example, by ON/OFF switching of an electric field at a predetermined frequency or using an electric field of alternating current. The spatial periodic modulation can be achieved, for example, by irradiation of high energy radiation through a mask having slits arranged at regular intervals. Such a modulated structure can be essential or very important to maximize the properties of a crystalline material in some cases. In the case of a crystal having a second order nonlinearity, for example, the orientation to fulfill a phase matching condition is limited. However, a maximum nonlinear response can not be always achieved in such an orientation. In such a case, a quasi phase matching by a periodical orientation control is required to enable the use in an orientation to achieve the maximum nonlinear response.

The kind of a crystal formed by irradiation can be controlled by controlling the pulse width of pulse radiation, radiation energy density, irradiation condition such as repetition rate, the type of an external field, field strength, and conditions of modulation or by controlling the composition of an amorphous base material. By adjusting the compositions of two or more amorphous materials so that the pulse light irradiating conditions required for crystallization are the same, and irradiating pulse radiation continuously to the amorphous materials joined together, it is possible to produce en bloc amorphous materials in which crystals of different types are formed. The same effect can be also achieved by varying the conditions of pulse light irradiation and application of an external field continuously or discontinuously. This method enables production of a composite material including crystals of different types formed in a single amorphous base material or in different materials joined together into a single piece. Production of such a composite amorphous material facilitates device miniaturization and integration such as integration of nonlinear optical device and high speed modulation device.

Moreover, by optimizing conditions of pulsed light irradiation and/or conditions of external field application, it is possible to produce an amorphous material enclosing firmly a crystal phase which is impossible by nature to be grown under normal conditions of room temperature and atmospheric pressure. In part of ferroelectrics, for example, there is a subtle relation of composition-temperature-stability of crystal phase, and the stable composition as ferroelectrics around the room temperature is limited (as known from J. Lian et al. Ferroelectrics, vol. 96, 127–130 (1989)). In ordinary methods for growing ferroelectric crystals, it is almost impossible to form and utilize crystal phases other than crystals stables at room temperature and atmospheric pressure. In crystallization by pulsed light, by contrast, a crystal is restricted in a surrounding amorphous material, so that motion of atoms and volume change are very difficult. Therefore, a high pressure phase such as a high temperature high pressure phase and a low temperature high pressure phase can be formed in a restricted condition developing a normally unattainable high pressure and suppressing a phase change practically impossible, it is possible to form a high temperature high pressure phase and a low temperature high pressure phase. This method makes it possible to utilize compositions and crystal phases which are conventionally unusable. In general, a crystal of such a high pressure phase has a high density and a high refractive index, so that it is possible to introduce a high specific refractive index difference with respect to a surrounding amorphous phase. For example, jadeite is higher in refractive index by about 6% than a glass of the same composition. Crystal growth of jadeite at room temperature requires a high pressure of $5 \times 10^8$ Pa or higher, so that hydrothermal synthesis is needed to grow jadeite artificially. Formation of regions of such a high refractive index in an amorphous material is advantageous in enhancing optical recording density. The method according to the present invention makes feasible continuous variation of the pressure from the atmospheric pressure to high pressure, and thereby creates the possibility of growing high pressure phases of a high pressure range equal to or higher $10^7$ Pa, overcoming the difficulty the conventional growing methods encounter.

The crystal forming method according to the present invention is applicable not only to inorganic materials but to organic materials and organic-inorganic composite materials as well. In one example, one or more crystalline regions are formed by irradiation of pulsed light to one or more selected portions of organic material (polymer in particular) in an amorphous state at room temperature. In another example, an organic-inorganic composite material is changed to an organic-inorganic mixture by irradiating pulse radiation to one or more selected portions of the organic-inorganic composite material to separate phases and form one or more crystalline regions.

The application of selectively crystallized amorphous materials produced by the method according to the present invention is very wide. Some examples are: wavelength converting device utilizing second order nonlinear characteristic, an optical isolator utilizing photomagnetic effect, laser material using as active ions rare earth or transition metal ions, high speed modulation device and light switch utilizing photoelectric effect.

The production method according to the present invention provides materials having high performance crystals selectively formed in mass-producible amorphous materials. Moreover, the production method can provide one-dimensional, two-dimensional and three-dimensional arrangements, and facilitates production of multi-function crystal circuit, combination of functions and minute integration to such a level to fulfill requirements of various optical devices needed in optical communication and field of laser.

The following are practical examples of the present invention. The invention is not limited to these examples.

Practical Example 1

Figure 2:
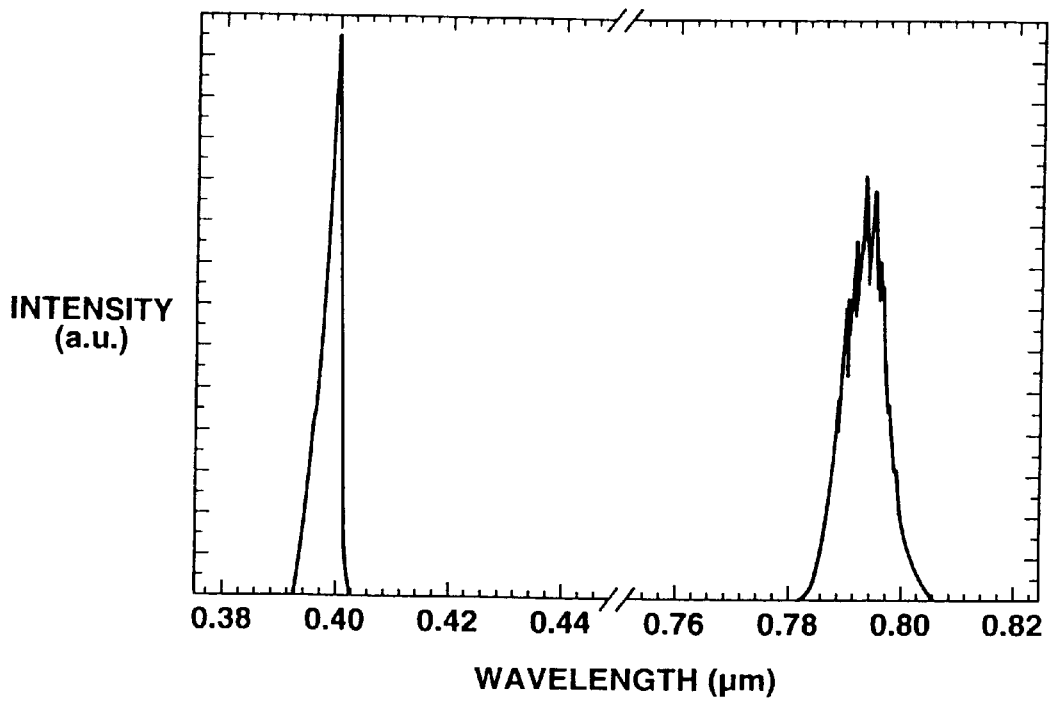
FIG. 2 is a graph showing the spectrum of radiation obtained by conversion from laser light of 0.796 $\mu$m to ½ wavelength with a crystal produced in a first practical example of the present invention.

An amorphous base material was Ba—Si—B—O glass (glass composition: 46BaO—2SiO$_2$—52B$_2$O$_3$ in mol %). Laser light having a pulse width of 120 fs (1 fs=10$^{-15}$ sec) and pulse energy of 1 mJ was condensed and irradiated into the inner part of the glass (FIG. 1). As a result, crystallization proceeded only in a portion to which condensed light was irradiated, and the surrounding bulk remained utterly uninfluenced. Then, the crystallized region was exposed to laser light having a wavelength of 0.796 μm, and the wavelength was converted to 0.398 μm. Irradiation of laser light of 0.796 μm to the original glass did not cause wavelength conversion. Therefore, the produced crystal solid proved to have a second order nonlinear characteristic. FIG. 2 shows the spectrum obtained by the wavelength conversion. The analysis by powder X-ray diffraction of the crystal taken out from the base glass proved that the crystal is β-BaB$_2$O$_4$.

In the example shown in FIG. 1, a light source is a Ti-sapphire laser, and an optical system includes a reflective mirror and a condenser lens for light condensation.

Practical Example 2

An amorphous base material was Li—Al—Ti—B—O glass (glass composition: 32Li$_2$O—3Al$_2$O$_3$—3TiO$_2$—62B$_2$O$_3$ in mol %). Laser light having a pulse width of 120 fs (1 fs=10$^{-15}$ sec) and pulse energy of 1 mJ was condensed and irradiated into the inner part of the glass. As a result, crystallization proceeded only in a portion to which condensed light was irradiated, and the surrounding bulk remained utterly uninfluenced. When laser having a wavelength of 0.8 μm was irradiated to the crystallized region, the wavelength was converted to 0.4 μm. Irradiation of laser light of 0.8 μm to the original glass did not cause wavelength conversion. Therefore, the produced crystal solid proved to have a second order nonlinear characteristic. The analysis by powder X-ray diffraction of the crystal taken out from the base glass proved that the crystal is Li$_2$B$_4$O$_7$.

Practical Example 3

By a process substantially identical to the process of the practical example 1, using the same glass, a crystal solid was formed while an electric field was applied to the glass. The glass was 5 mm thick and the voltage was 20 KV. To examine a distribution of crystal orientation of a produced crystalline region, an extension ratio was measured. The measurement showed that the extinction ratio was increased by 20 times by application of the electric field as compared to the example without application of an electric field. This result showed that crystals are orientated in one direction. Moreover, the wavelength conversion efficiency was increased by 5 times as compared to the example without application of an electric field.

Practical Example 4

Fe was added by an amount of 100 ppm to a glass having the same composition as the glass of the practical example 1, and the thus-prepared glass was used in a process substantially identical to the process of the practical example 1. A crystal solid was formed while a magnetic field was applied to the glass. The glass was 2 mm thick and the strength of the magnetic field was 50000 Am$^{-1}$. To examine a distribution of crystal orientation of the produced crystalline region, the extinction ratio was measured. The measurement showed that the extinction ratio was increased by 10 times by application of the magnetic field as compared to the example using no magnetic field. This result showed that crystals are orientated in one direction. Moreover, comparison of wavelength conversion efficiencies showed that the wavelength conversion efficiency was increased by 2 times as compared to the example using no magnetic field.

Practical Example 5

A single crystal of β-BBO (seed crystal) was preliminarily joined to a glass having a composition of 54B$_2$O$_4$—46BaO (in mol %). The seed crystal was joined to the glass in a completely tight manner by softening the glass and pressing the seed to the glass. In the same manner as in the practical example 1, laser was irradiated to the joint portion between the glass and the seed crystal to cause crystallization to begin from the joint portion. By this irradiation, a β-BBO single crystal was grown from the seed crystal with the same orientation. The wavelength conversion efficiency in converting light of 0.8 μm to 0.4 μm was equal between the seed crystal, and the grown single crystal. From this result, it is understood that a single crystal having good optical properties can be selectively formed in a glass. The crystal growth rate was about 10 mm/min. This means that a crystal can be grown at a very high speed. The single crystal grown in this way was confined in the glass, and there were no free surfaces. Therefore, this single crystal has no crystal habit and has ideal properties as a waveguide.

Practical Example 6

By a process substantially identical to the process of the practical example 1, using the same glass, a crystal solid was formed while a periodical electric field was applied to the glass. The periodical electric field was applied with the use of a comb electrode. The glass was 2 mm thick, the voltage was 5 KV and the reversal period of the electric field was 2 mm. The measurement of the extinction ratio showed that the extinction ratio was increased by 20 times by application of the electric field as compared to the example without application of an electric field. This result showed that crystals are orientated in one direction. Moreover, as the result of cutting and polishing such that a length was adjusted to obtain a maximum wavelength conversion efficiency, the wavelength conversion efficiency was increased by 5 times as compared to the example without application of an electric field.

Practical Example 7

Figure 3:
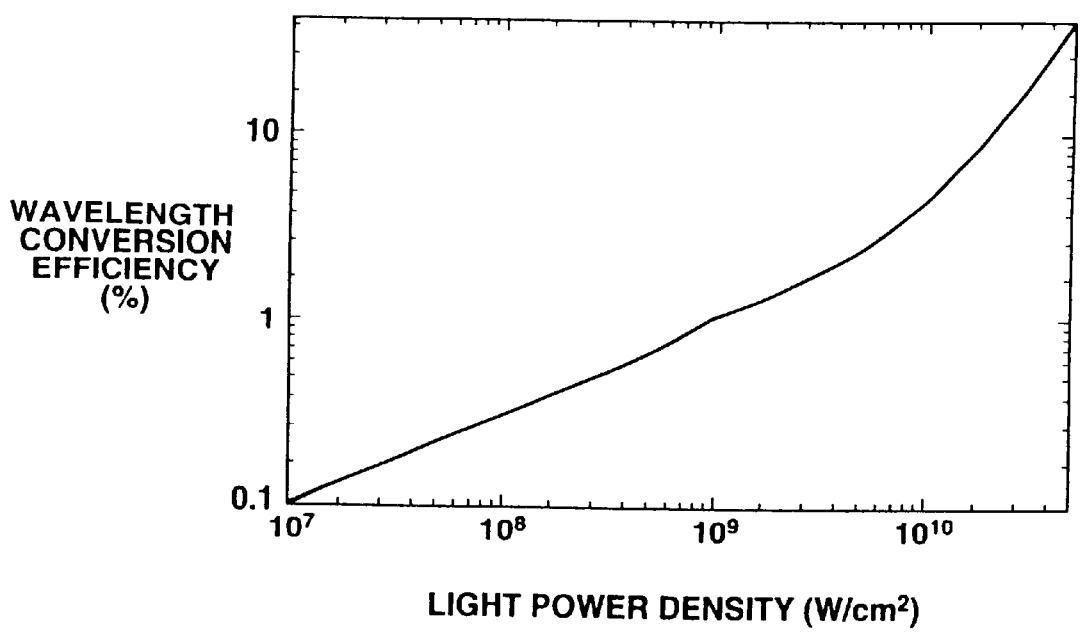
FIG. 3 is a graph showing a relationship between light power density and wavelength conversion efficiency.

In a crystal forming process identical to that of the practical example 1, using a glass of the same composition, a relation between light power density at a point of light condensation and wavelength conversion efficiency was examined to seek conditions required for formation of crystals. The number of incident pulses was 200 shots consistently. The result is shown in FIG. 3. In this example, the wavelength conversion efficiency is (outgoing energy of 0.396 μm)/(incoming energy of 0.796 μm). To obtain a practicable wavelength conversion device having a conversion efficiency of 1% or higher, a power density equal to or greater than 10$^9$ W/cm$^2$ is required. Moreover, a light condensing system can be arranged to increase the power density to a level equal to or higher than $10^9$ W/cm$^2$ only in a selected portion inside the glass, and to produce a crystalline region completely surrounded by the glass.

Practical Example 8

By a process with application of a magnetic field as in the example 4, a crystalline region was formed in a glass of $30Y_2O_3$—$25Fe_2O_3$—$35SiO_2$—$10Na_2O$ (in mol %). The result of powder X-ray diffraction analysis showed that a formed crystal was $Y_3Fe_5O_{12}$. Between a region of glass, and a crystalline region, a ratio of Faraday rotation power was 1:3. Thus, the crystalline region was superior in efficiency to the glass.

Practical Example 9

By using, as a spattering target, a glass having the same composition as in the practical example 8, an amorphous film was formed on a quartz glass. The thickness of the film is 20 μm. A crystal region was formed in this film by a process with application of a magnetic field as in the example 4. The X-ray powder diffraction showed that a crystal was $Y_3Fe_5O_{12}$. Faraday rotation power ratio was 1:5 between the amorphous region and the crystalline region. Thus, the crystalline region proved superior in efficiency to the amorphous film.

Practical Example 10

By a crystallizing process identical to the process of the practical example 1, a crystal solid was formed with application of a uniform electric field. The voltage was 5 kV, and the thickness of the glass is 2 mm. The glass composition was $29.5Y_2O_3$—$0.5Nd_2O_3$—$20Al_2O_3$—$5Ti_2O_3$—$35SiO_2$—$10Na_2O$ (in mol %). The result of X-ray powder diffraction analysis confirmed that a crystal was $Y_3Al_5O_{12}$ (YAG). Laser having a wavelength of 0.8 μm was condensed to the crystallized region and a resonator was formed to effect laser oscillation. As a result, in the case of excitation power of 2 W, pulsed laser oscillation was confirmed with a repetition frequency of 10 Hz, and energy of 20 μJ/pulse. The wavelength of oscillation was 1.06 μm like Nd:YAG.

Practical Example 11

By a crystallizing process identical to the process of the example 1, a crystal solid was formed with application of a uniform electric field. The voltage was 5 kV, and the thickness of the glass is 2 mm. The glass composition was $30LiF$—$30SrF_2$—$29.5AlF_3$—$0.5CrF_3$—$10Ba(PO_3)_2$ (in mol %). The result of X-ray powder diffraction confirmed that the obtained crystal solid is $LiSrAlF_6$ (LiSAF). Laser having a wavelength of 0.63 μm was condensed to the crystallized region and a resonator was formed to effect laser oscillation. As a result, in the case of excitation power of 2 W, pulsed laser oscillation was confirmed with a repetition frequency of 10 Hz, and energy of 8 μJ/pulse. The wavelength of oscillation was 0.8 μm like Cr:LiSAF.

Practical Example 12

By using, as a spattering target, a glass of $30Li2O$—$49Nb2O5$—$1MgO$—$20SiO2$ (in mol %), an amorphous film was formed on a quartz glass. The thickness of the film is 20 μm. A crystal region was formed in this film by a process with application of an electric field with a comb electrode as in the example 6. When the electric field was turned on and off while light having a wavelength of 1.5 μm was transmitted through the crystallized region, variation in the intensity of the transmitted light was observed. Thus, the photoelectric effected was confirmed.

Practical Example 13

In a glass having a composition of $17Na_2O$—$17Al_2O_3$—$66SiO_2$ (in mol %), a crystal solid was formed by a process similar to the process of the practical example 1. Measurement and analysis of refractive index and birefringence of the produced crystal solid confirmed that the crystal was jadeite formable at room temperature only under high pressures equal to or higher than $5\times10^8$ Pa. The refractive index of the surrounding glass was 1.54, and the refractive index of the crystal region was 1.64. The increase of the refractive index was confirmed.

Practical Example 14

A raw glass material having a composition of $40LiF$—$34YF_3$—$1EuF_3$—$25Ba(PO_3)_2$ (in mol %) was melted in $N_2$ containing 1 vol % $H_2$, and Eu was reduced to bivalent. By a process of applying an electric field to this glass as in the practical example 10, a crystal solid was formed. In the thus-obtained material, the glass matrix contained bivalent Eu, and the crystal solid was $LiYF_4$ (YLF) crystal containing trivalent Eu. Laser having a wavelength of 464 nm was condensed to the crystallized region and a resonator was formed to effect laser oscillation. As a result, in the case of excitation power of 0.5 W, pulsed laser oscillation was confirmed with a repetition frequency of 10 Hz, and energy of 2 μJ/pulse. The wavelength of oscillation was 0.61 μm like trivalent Eu:YLF.

The process according to the present invention is a process capable of producing high efficiency, high performance single crystal or polycrystalline region or regions in a three dimensional arrangement in an uncostly, mass-producible amorphous material. An amorphous material containing one or more single crystals or polycrystals produced by this process is superior as material for achieving second order nonlinear optical effect, photomagnetic effect, photoelectric effect, and laser oscillation. The material can be used for producing crystal devices and crystal circuits needed in light communication and laser technique. Thus, the present invention can significantly improve performance of light communication system and laser system and contribute downsizing, improvement in efficiency and cost reduction.

What is claimed is:

1. A selectively crystallized amorphous material comprising:
   an amorphous background region; and
   a crystalline region formed selectively in the amorphous background region by irradiating the amorphous region selectively with pulsed light of wavelength inabsorbable in the amorphous region and condensing the pulsed light to a selected region for crystallization in the selected region, the crystalline region being enclosed by the amorphous region.

2. A selectively crystallized amorphous material according to claim 1 wherein the crystalline region has one of a single crystal structure and a polycrystalline structure.

3. A selectively crystallized amorphous material according to claim 1 wherein a crystalline solid in the crystalline region has a second order nonlinear optical characteristic.

4. A selectively crystallized amorphous material according to claim 1 wherein a crystalline solid in the crystalline region has a magneto-optical characteristic.

5. A selectively crystallized amorphous material according to claim 1 wherein a crystalline solid in the crystalline region has a characteristic for serving as a laser oscillation medium having, as active ions, one of rare earth ions and transition metal ions.

6. A selectively crystallized amorphous material according to claim 1 wherein a crystalline solid in the crystalline region has a photoelectric characteristic.

7. A selectively crystallized amorphous material according to claim 1 wherein the crystalline region is in one of the shape of a string and the shape of a plate.

8. A selectively crystallized amorphous material according to claim 1 wherein the selectively crystallized amorphous material comprises a plurality of crystalline regions which are interconnected in one of a two-dimensional manner and a three-dimensional manner.

9. A selectively crystallized amorphous material comprising:
    an amorphous background region; and
    a crystalline region formed selectively in the amorphous background region by irradiating the amorphous region selectively with pulsed light of wavelength inabsorbable in the amorphous region and condensing the pulsed light to a selected region for crystallization in the selected region, the crystalline region including a portion surrounded by the amorphous region,
    wherein the crystalline region is buried under an amorphous surface formed by the amorphous background region.

10. A selectively crystallized amorphous material as claimed in claim 1, wherein the amorphous region comprises an amorphous material including at least one element selected from the group consisting of B, Ti, Ta, Nb, La, W, Mo, Si, Li, Ca, Sr, Ba, Bi, Al and Ga.

11. A selectively crystallized amorphous material as claimed in claim 3, the crystalline region comprises a crystalline solid containing, as positive ion, one of Nb, La, Li and B.

12. A selectively crystallized amorphous material according to claim 3, wherein the crystalline region comprises a crystalline solid of at least one member selected from the group consisting of KTiOPO4, LiNbO3, LiTaO3, LiB3O5, βBaB2O4, CsLiB6O10, and GdCa4B3O10.

13. A selectively crystallized amorphous material as claimed in claim 12, wherein the amorphous region comprises Li2O—SiO2—B2O3 amorphous, and the crystalline region comprises LiB3O5.

14. A selectively crystallized amorphous material as claimed in claim 12, the amorphous region comprises Li2O—Nb(Ta)2O5—SiO2, and the crystalline region comprises LiNbO3 or LiTaO3.

15. A selectively crystallized amorphous material as claimed in claim 12, the amorphous region comprises SiO2—BaO—B2O3 and the crystalline region comprises β—BaB2O4.

16. A selectively crystallized amorphous material as claimed in claim 4, wherein the crystalline region comprises a crystalline solid containing transition metal or rare earth.

17. A selectively crystallized amorphous material as claimed in claim 16, wherein the amorphous region comprises Y2O3—Fe2O3—SiO2—Na2O amorphous, and the crystalline region comprises Y3Fe5O12.

18. A selectively crystallized amorphous material as claimed in claim 5, wherein the crystalline solid in the crystalline region comprises, as the additive, a rare earth or transition metal.

19. A selectively crystallized amorphous material as claimed in claim 18, wherein the crystalline solid in the crystalline region comprises, as the additive, at least one element selected from the group consisting of Ce, Pr, Nd, Eu, Dy, Ho, Er, Tm, Yb, Cr, Mn, Fe, Ni and Ti.

20. A selectively crystallized amorphous material as claimed in claim 18, wherein the crystalline solid in the crystalline region comprises, as the additive, at least one element selected from the group consisting of Ce, Pr, Nd, Eu, Dy, Ho, Tm, Yb, Cr, Mn, Ni, Fe and Ti.

21. A selectively crystallized amorphous material as claimed in claim 18, the crystalline region comprises at least one member selected from the group consisting of Y3Al5O12, Gd3Ga5O12, LiYF4, LiSrAlF6, Al2O3, and ruby.

22. A selectively crystallized amorphous material as claimed in claim 18, wherein the amorphous region comprises Y(Gd)2O3—Al(Ga)2O3—SiO2—Na2O, and the crystalline region comprises Y3A5O12.

23. A selectively crystallized amorphous material as claimed in claim 18, wherein the amorphous region comprises Y(Gd)2O3—Al(Ga)2O3—SiO2—Na2O, and the crystalline region comprises Gd3Ga5O12.

24. A selectively crystallized amorphous material as claimed in claim 18, wherein the crystalline region comprises LiYF4.

25. A selectively crystallized amorphous material as claimed in claim 18, wherein the amorphous region comprises LiF—SrF2—AlF3—Ba(PO3)2, and the crystalline region comprises LiSrAlF6.

26. A selectively crystallized amorphous material as claimed in claim 6, wherein the crystalline region comprises a compound containing at least one element selected from the group consisting of Ti, Ta, Nb, W, Mo, Si, Li, Ca, Sr, Ba, Bi, Al and Ga, and the compound is one of oxide and fluoride.

27. A selectively crystallized amorphous material as claimed in claim 26, wherein the crystalline region comprises at least one member selected from the group consisting of BaTiO3, Sr0.75Ba0.25Nb2O6, Ba2NaNb5O15, La3Ga5SiO14, Bi12SiO20, Bi12GeO20, and Pb(Zr, Ti)O3.

28. A selectively crystallized amorphous material as claimed in claim 26, wherein the amorphous region comprises BaO—TiO2—SiO2 amorphous, and the crystalline region comprises BaTiO3.

29. A selectively crystallized amorphous material as claimed in claim 26, wherein the amorphous region comprises SrO—BaO—Nb2O5—SiO2 and the crystalline region comprises Sr0.75Ba0.25Nb2O6.

30. A selectively crystallized amorphous material as claimed in claim 26, wherein the amorphous region comprises La2O3—Ga2O3—SiO2 and the crystalline region comprises La3Ga5SiO14.

31. A selectively crystallized amorphous material as claimed in claim 26, wherein the amorphous region comprises Bi2O3—SiO2 and the crystalline on comprises Bi12SiO20.

32. A selectively crystallized amorphous material comprising:
    an amorphous background region; and
    a crystalline region formed in the amorphous background region by irradiation of pulsed light to the amorphous region, the crystalline region being enclosed within the amorphous region so that crystallization proceeds under pressure higher than atmospheric pressure.

33. A selectively crystallized amorphous material as claimed in claim 32, wherein the crystalline region comprises jadeite.

* * * * *